United States Patent [19]
Bert et al.

[11] Patent Number: 4,792,773
[45] Date of Patent: Dec. 20, 1988

[54] ULTRA HIGH FREQUENCY CIRCUIT WITH LOW PARASITE CAPACITIES

[75] Inventors: Alain Bert; Serge Malbe, both of Gif-sur-Yvette, France

[73] Assignee: Thomson-CSF, Paris, France

[21] Appl. No.: 908,672

[22] Filed: Sep. 17, 1986

[30] Foreign Application Priority Data

Sep. 20, 1985 [FR] France ............... 85 13952

[51] Int. Cl.$^4$ ........................... H01P 3/08
[52] U.S. Cl. .................... 333/246; 333/247
[58] Field of Search ............ 333/238, 246, 247; 361/399

[56] References Cited

U.S. PATENT DOCUMENTS

| | | | |
|---|---|---|---|
| 3,659,228 | 4/1972 | Napoli | 333/116 |
| 4,211,986 | 7/1980 | Tajima | 333/246 X |
| 4,251,817 | 2/1981 | Kimura et al. | 333/247 X |
| 4,375,054 | 2/1983 | Pavio | 333/116 |
| 4,394,633 | 7/1983 | Klein | 333/246 X |

FOREIGN PATENT DOCUMENTS

2514562 10/1981 France .
2118371 10/1983 United Kingdom .

Primary Examiner—Eugene R. LaRoche
Assistant Examiner—Seung Ham
Attorney, Agent, or Firm—Oblon, Fisher, Spivak, McClelland, & Maier

[57] ABSTRACT

An ultra high frequency circuit constructed in hybrid or integrated form whose parasite capacities are greatly reduced. The ultra high frequency circuit has, besides the components, at least one component fixing metallization and at least one microstrip formed by a metal track, on a first face of a dielectric substrate and, a ground plane metallization on a second face of the substrate. The ultra high frequency circuit is fixed to the base of a case. In order to reduce the parasite capacities formed between metallizations, the second metallized face of the substrate is locally demetallized, in line with the fixing metallization, and an air layer is introduced between the demetallized substrate and the base of the case.

7 Claims, 2 Drawing Sheets

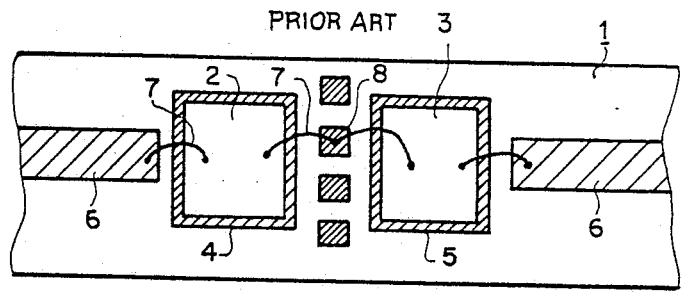
FIG_1 PRIOR ART
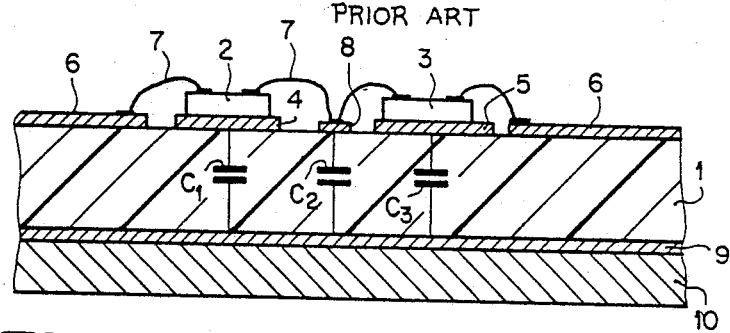
FIG_2 PRIOR ART
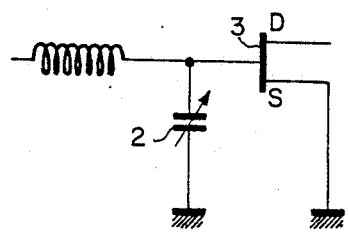
FIG_3
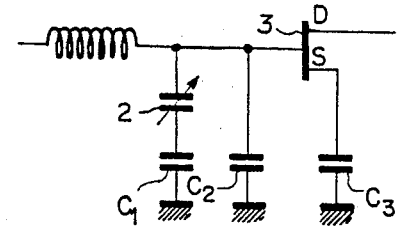
FIG_4
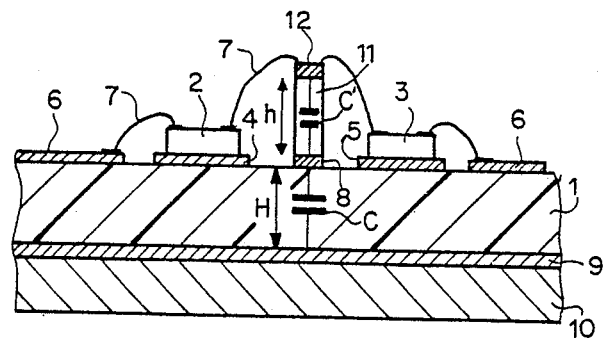
FIG_5 PRIOR ART

FIG_6
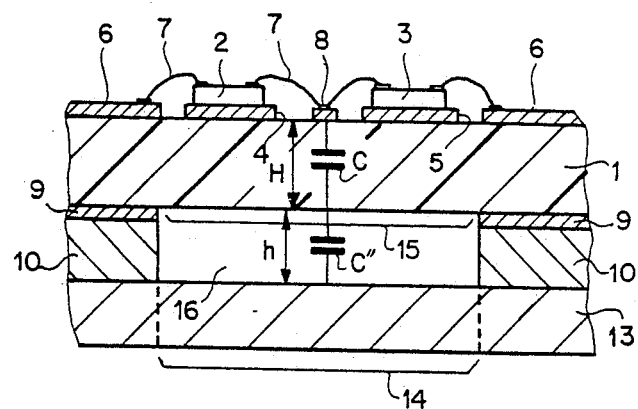
FIG_7
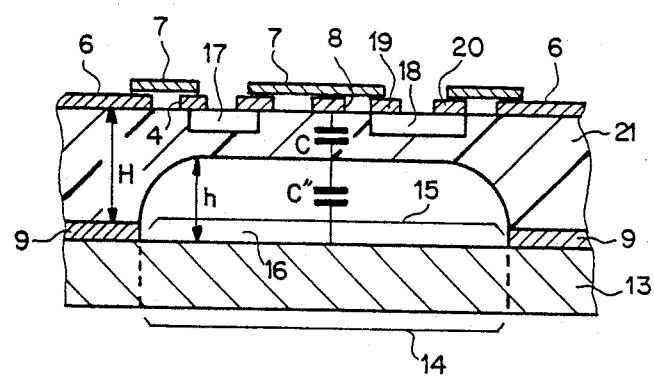

ULTRA HIGH FREQUENCY CIRCUIT WITH LOW PARASITE CAPACITIES

BACKGROUND OF THE INVENTION

The present invention relates to an ultra high frequency circuit improved by reduction of the parasite capacities which are formed between metallizations carried by the two main faces of the substrate of the circuit. Not only the ultra high frequency circuits constructed in hybrid form on a substrate formed by a ceramic wafer but also those constructed in integrated form on a substrate formed by a semi conductor material wafer which has been made semi insulating, such as GaAs for example, are concerned by the invention.

All ultra high frequency circuits include, whatever the functions they fulfill, a certain number of common elements. They are formed on a substrate made from a dielectric material having, on the first main face, active components-diodes, transistors, integrated circuits-conducting tracks in the form of microstrips and metallizations which serve as cabling relays or impedance adjusting segments for example. Active components are fixed to the substrate by means of metallized areas. Moreover, the second main face of the substrate is totally metallized so as to form a first ground plane for the ultra high frequency circuit. This metallization is further required for generating fixed impedance lines formed by a microstrip parallel to a ground plane and separated therefrom by a dielectric. It serves finally for fixing the ultra high frequency circuit on a support or metal case which also forms a second ground plane.

On the other hand, the metallization areas -other than the microstrips- and the metallized segments form with the ground plane parasite capacities of which the substrate forms the dielectric The parasite capacities have negligible values under static or DC current conditions but are unacceptable under ultra high frequency conditions, since they detune the circuit.

SUMMARY OF THE INVENTION

The invention tends to considerably reduce the value of these parssite capacities in an ultra high frequency circuit by introducing, in series with each parasite capacity, a capacity whose dielectric is air.

This air capacity is obtained by:

the localized suppression of the metallization of the ground plane carriedbby the second face of the substrate in the regions corresponding to the metallized areas carried by the first face of the substrate, introduction of an air layer in the regions in which the metallization of the ground plane is suppressed, between the substrate and a second ground plane formed by the metal support or case of the ultra high frequency circuit.

In other terms, the parasite capacities are reduced in value by localized removal of the ground plane and interpositioning between the bare demetallized substrate and the remote ground plane of an air capacity of very low value since the dielectric constant of air, equal to 1 by definition, is less than the dielectric cnnstant of any substrate whatever.

In addition, an ultra high frequency circuit is generally integral with a metal support which is either a sole piece for fixing in a mechanical assembly, or an encapsulation case. This metal support forms a second ground plane. For reducing the parasite capacities, the second ground plane is pierced at the positions where the metallization of a first ground plane is suppressed. More precisely, the invention consists of an ultra high frequency circuit with low parasite capacities, including a dielectric material substrate and, on a first face of this substrate, at least one component fixing metallization for the ultra high frequency circuit and at least one connection line of the microstrip type formed by a conducting track and by a ground plane metallization, this latter being on a second face of a substrate itself supported by a metal base of a case, this ultra high frequency circuit further including, so as to reduce the parasite capacities which are formed between metallizations on both faces of the substrate, at least one local demetallization of the ground plane on the second metallized face of the substrate, n at least one region in line with the transfer metallization on the first face of the substrate, and an air layer between the demetallized substrate and the base of the case, this air layer having a thickness at least equal to 100 microns.

BRIEF DESCRIPTION OF THE DRAWINGS

The invention will be bettrr understood from the following description of two examples of applications, with reference to the accompanying Figures which show:

FIGS. 1 and 2: top and sectionl views respectively of an ultra high frequency circuit element, including components common to all the ultra high frequency circuits and showing the formation of the parasite capacities in the prior art;

FIG. 3: a diagram of an ideal ultra high frequency oscillator,

FIG. 4: a real diagram of the ultra high frequency oscillator of FIG. 3, formed in accordance with the technology of FIG. 2;

FIG. 5: a sectional view of an ultra high frequency circuit having a known means for reducing the parasite capacity of a wiring stud:

FIG. 6: a sectional view of an ultra high frequency circuit according to the invention, in hybrid form and FIG. 7: a sectional view of a ultra high frequency circuit of the invention, in integrated form.

DESCRIPTION OF THE PREFERRED EMBODIMENTS

FIG. 1 shows a partial top view of an ultra high frequency circuit. This includes an insulating substrate 1, that is to say made from a material havingaa dielectric constant which is proper to it, on which are added at least two active or passive components 2 and 3. The components 2 nd 3 are fixed to substrate 1 by means of metallizations 4 and 5 which have the form and the outside dimensions of components 2 and 3 which allows the components to be soldered or brazed to the substrate. The interconnecting network in an ultra high frequency circuit is provided by means of microstrips 6 and the connection between the end of a microstrip and a component is provided by wires or ribbons 7 soldered to the microstrip,6 and to the component. In order to improve the reliability of the circuit and in some cases to shorten the length of connections 7, ultra high frequency circuits frequently comprise metallizations 8 which serve as relay studs for soldering a wire 7 between two components, or for tuning the impedance of a circuit.

This same circuit is shown in FIG. 2, in section, and it can be seen in this FIG. 2 that the rear face, that is to say the second main face of the substrate 1, is very generally metallized over the whole of its surface at 9. This metallization 9 forms a first ground plane of the ultra high frequency circuit and it is necessary for forming the microstrips with the interconnection networks 6 which are deposited on the first main face of the substrate. In addition, ultra high frequency circuits are frequently fixed to a metal sole piece 10 which forms then a second ground plane for the hybrid circuit, this sole piece serving either for fixing the circuit in a larger mechanical assembly or for forming the encapsulation case.

Thus between the metallizations deposited on the first main face of the substrate and the metallization 9 on the second main face of the substrate parasite capacities are formed for which the material of the dielectric substrate 1 forms the dielectric. In the example chosen for FIG. 1, the metallization 4 of a first component 2 forms with the ground plane a first parasite capacity C1, the relay stud 8 forms with the ground plane a second parasite capacity C2 and the metallization 5 of a second component 3 forms with the ground plane a third parasite capacity C3. Because of the extremely small dimensions of these metallizations these parasite capacities are negligible under static or DC current conditions. They are no longer so under ultra high frequency conditions, since the dimensions change in importance under ultra high frequency conditions and since even the length of the wires or ribbons 7 then form self inductances.

For showing the harmful role of these parasite capacities, the case may be considered shown in FIG. 3 of an ultra high frequency oscillator. This Figure is reduced to its strict minimum and a varactor 2, which may for example be the component 2 of FIGS. 1 and 2, drives a field effect transistor 3 which may just as well be the component 3 of FIGS. 1 and 2. Without going into details, self inductances allow this oscillator to be supplied and an oscillating circuit to be introduced on the grid of the field effect transistor 3. This diagram is an ideal diagram, but it is formed in accordance with the technology of FIGS. 1 and 2, the parasite capacities C1, C2 and C3 are introduced andtthe diagram of FIG. 3 becomes the real diagram of FIG. 4.

Although, in ultra high frequency circuits it is usual to take into account the parasite inductances and capacities which develop in these circuits, the presence of a parasite capacity such as C2 corresponding to the wiring stud is inadmissible since it detunes the circuit.

It is then necessary to find a method for reducing the size of the parasite capacitied presently known method is shown in FIG. 5 in a sectional view. In this FIG. 5 we find again the same elements as in FIG. 2, but, by way of non limitative example, th wiring stud 8 is replaced by a block of molten silica 11. More exactly, onto the metallization 8 of the wiring stud is fixed a block of material whose dielectric constant is lower than that of the substrate. If, for example, the dielectric substrate is alumina, with a dielectric constant $\epsilon_r = 9.8$, the block 11 is formed of molten silica whose dielectric constant is $\Delta'_r = 3.9$. The end 12 of this dielectric block 11 is itself metallized and it is on the metallization 12 that wiring or the wiring relay of wires or ribbons 7 is provided between two components such as components 2 and 3.

This known method is interesting in itself but still does not provide a sufficient reduction of the dielectric constant, as the following calculation shows.

For a metallization such as a wiring stud 8, the capacity which it forms with the substrate and the ground plane is expressed unde static conditions by the value:

$$C = \frac{\epsilon_o \epsilon_r S}{H}$$

in which $\epsilon_o$ is the dielectric constant of air, $\epsilon_r$ is the dielectric constant of the substrate, S is the area of the stud and H is the thickness of the substrate.

The value of the parasite capacity C could be reduced by reducing S and increasing H but this is not possible for the area of stud S is fixed by connection requirements or is related to deign rules, and the thickness of substrate H is fixed by ultra frequency requirements, on which dielectric substrate other circuits are etched.

Let us take by way of non limitative example of the invention an alumina dielectric substrate of thickness $H = 0.4$ mm, with a dielectric constant $\epsilon_r = 9.8$ and a block 11 having a thickness 0.6 mm and a section of 0.4 mm$^2$, made from molten silica having a dielectric constant $\epsilon'_r = 3.9$. The area of stud 8 on which block 11 is fixed must have at the minimum the same area as this latter, that is to say $S \simeq (0.4)^2$. The two capacities in series C and C', C being the capacity formed by the metallization stud 8 and the ground plane 9, and C' being the capacity formed by the block 11 and its two metallizations 8 and 12 are equivalent to an equivalent capacity $C_{eq}$ such that:

$$\frac{1}{C_{eq}} = \frac{1}{C} + \frac{1}{C'}$$

i.e. $\frac{H+h}{\epsilon_{eq}} = \frac{H}{\epsilon_r} + \frac{h}{\epsilon'_r}$ in which h is the height of the molten silica block 11, that is to say the dielectric material thickness between the two plates 8 and 12 of the capacitor C'.

This gives $\epsilon_{eq} \simeq 5$, which appreciably reduces the initial dielectric constant $\epsilon_r = 9.8$. The capacity equivalent to the two capacities C and C' in series is in the ratio $C_{eq}/C = 0.2$, with respect to the parasite capacity C: we have then reduced the parasite capacity C by a factor 5. This result is still not sufficient and it has the drawback of introducing a molten silica block 11, of complicating the mounting reducing the potential reliability of the hybrid circuit and of considerably extending the connecting wires or ribbons 7 so the self inductances.

FIG. 6 shows a sectional view of an ultra high frequency circuit element of the invention, in the first case where this ultra high frequency circuit is in hybrid form. So as to simplify the understanding of the invention and reading of the drawings, the same reference indices as in the preceding Figures are kept.

The ultra high frequency circuit of the invention comprises an air layer between the dielectric substrate of the hybrid circuit and the gronnd plane, so as to introduce an air capacity C" in series with the parasite capacity C.

For generating this air layer, the invention provides two means:

first of all suppressing, in each region 14, corresponding to the metallizations of the first main face of the substrate which are likely to create parasite capacities, such as metallizations 4,,5 and 8 of FIG. 2, an area 15, equivalent to region 14, of the ground plane metallization 9 carried by the second main face of the substrate, which therefore suppresses one plate of the parasite capacity C, then introducing, in series with the ceramic dielectric capacity C, an air capacity C", of low value, obtained by means of an air layer 16, created for example by recessing the metal part of the sole piece 10 which forms a second ground plane, over an area corresponding to the demetallization 15 practiced in the ground plane metallization 9. In the most general case where the hybrid circuit itself is introduced inside a case one part 13 of which forms a new ground plane, the parasite capacity which was originally formed solely by capacity C is replaced by two series capacities C and C", with moreover the removal of the intermediate plate since the ground plane metallization 9 has been suppressed. This demetallization may be obtained in two ways, either by masking and etching, a substrate totllly metallized on its rear face, for removing the metal which was at 15, or on the contrary, by masking region 15 before deposition of the metallization 9.

In all cases, the demetallized region 15 has larger dimensions than those of the component fixing metallization in line with which it is situated so as to avoid the leak lines of the electric field from the fixing metallization through the substrate.

Of course, the air layer 16 must have a signifcant thickness, much greater than the small thickness of the ground plane metallization 9, otherwise matching of the ultra high frequency circuit is inefficient. For the results to be interesting, the thickness of the air layer 16 must be of the same order of size as the thickness H of the substrate and at least equal to this thickness H and in all cases greater than 100 microns.

In so far as the sole piece 10 is concerned forming the second ground plane, the simplest method, from the industrial production point of view, consists in forming a circular hole, this hole being even in some cases made through the wall of the case 13, such as shown in FIG. 6 by two broken lines.

To show the gain obtained by introducing an air capacity C" in series with the parasite capacity C, we can take the numerical example given with referece to FIG. 5, with an alumina substrate 1 fixed to a sole piece 10 of 0.5 mm in thickness and pierced for introducing an air layer 16. Then an equivalent capacity is obtained given by the expression:

$$\frac{1}{C_{eq}} = \frac{1}{C} + \frac{1}{C''}$$

i.e. $\frac{H+h}{eq} = \frac{H}{r} + h$ since $\epsilon_o = 1$, the dielectric constant of the air capality. Which gives $\epsilon_{eq} = 1.66$. The introduction of an air capaciyy formed by the thickness of the metal sole piece 10 reduces the initial capacity in the ratio $C_{eq}/C = 0.075$ which in fact reduces the parasite capacity by a factor 13.

Of course, capacity C" and the demetallization at 15 of the ground plane 9 are not necessarily unitary, that is to say carried out for each of the metallizations carried by the first main face of the substrate 1. Thus, in the case of FIG. 6, the presence of two active components 2 and 3 side by side has been kept, fixed by means of their metallizations 4 and 5 and a wiring relay 8. In this case, from the technological point of view, it is more advantageous to consider the whole of the regions likely to be interfered with by parasite capacitors for grouping them together in a single region in which an air layer 16 is introduced for reducing these parasite capacitors. Thus, in FIG. 6, to the three metallizatons 4, 5 and 8 there only corresponds a single demetallization at 15 of the rear face of the substrate and a single air layer 16. Which also means that, for the whole of a real ultra high frequency circuit, and not simply for a circuit element such as shown in FIG. 6. the substate is demetallized in a plurality of regions 14 and the sole pieces pierced by the same plurality of holes so as to create as many air capacitors as there are regions 14 sensitive to the parasite capacitors.

FIG. 7 shows a sectional view of an ultra high frequency circuit in accordance with the invention in a case where the circuit is in the form of an integrated circuit, for example on a semi insulating gallium arsenide substrate.

In a semi insulating gallium arsenide substrate 21 are formed at least two components, for example a diode 17 and a field effect transistor 18, so as to keep a possible comparison with the four preceding Figures. The first main surface of the gallium arsenide substrate supports microstrips 6, metallizations 4 for making contact with the diode, 19 and 20 for making contact with the transistor, as well as relay studs 8 either for wiring or for impedance matching. Depending on the form of integration, the electric contacts bttween microstrips and transistors or diodes are formed by wires or ribbons 7, or by metallizations deposited directly on the gallium arsenide and which provide contact between the metallization and microstrip studs.

In order to reduce the parasite capacities between the above mentioned metallizations and the ground plane metallization 9 carried by the second main face of the gallium arsenide substrate, the invention provides the introduction of an air layer, which may be provided in two ways. Either a rear demetallization at 15 of the ground plane 9 and piercing of the case in region 14. This method is industrially expensive for it requires forming holes in the metal cases. Consequently, it is more advantageous to carry out chemical etching of the rear face of the substrate so as to introduce into region 14 sensitive to the parasite capacities an air layer 16 which separates the bared substrate from the metal of case 13. Which forms a new ground plane. This chemical etching may be carried out in accordance with known methods by a masking and etching, and it has the advantage of being collective and of being carried out on a disk of gallium arsenide comprising a plurality of integrated circuits, before being cut up into separate integrated circuits.

In the case of an ultra high frequency circuit constructed in integrated form, if we assume that H=0.4 mm for the thickness of the gallium arsenide, h=0.2 mm as etching depth, and $\epsilon_r = 12.8$ for the gallium arsenide, the other data being the same as before, the calculation gives $\epsilon_{eq} = 1.80$ namely $C_{eq}/C = 0.14$. The parasite capacity has therefore been reduced by a factor 7 in the case of an integrated circuit, while assuming that so as not to make the substrate of the integrated circuit fragile the etching depth h is limited to half the thickness of the dielectric.

Of course the invention is limited neither to the type of hybrid or integrated substrate which serves for describing the invention, nor to the case of a diode and a transistor implanted on the surface of an ultra high frequency circuit. The advantage of the circuit of the invention consists in that the parasite capacities are locally reduced, that is to say while complying with the impedance matching of the input and output lines in the form of microstrips 6. Another advantage of the circuit of the invention also consists in the fact that its matching does not have an influence on the mounting, and the wiring of the different components of the ultra high frequency circuit. This matching may even be applied to an existing circuit essentially in the case of a hybrid circuit, by locally demetallizing its rear face, that is to say by forming openings 15 in its ground plane and by piercing the sole piece on which the hybrid circuit is mounted.

The invention, which has been described with reference to two cases chosen by way of examples, includes all the variants evident to a man skilled in the art and is clearly stated in the following claims.

What is claimed is:

1. An ultra high frequency circuit with low parasitic capacitance, comprising:
    a dielectric material substrate;
    at least one metallization on a first face of said substrate for fixing a component of the ultra high frequency circuit;
    a ground plane metallization on a second face of said substrate;
    a case having a metal base which supports said ground plane;
    a microstrip type connection line being formed by a microstrip on said first face and said ground plane metallization;
    one local dematallization of said ground plane in a region opposite said fixing metallization;
    an air layer in said region between said substrate and said base having a thickness of at least 100 microns;
    wherein the parasitic capacitance between the metallizations on said first and second faces of said substrate is reduced by said local demetallization.

2. The ultra high frequency circuit as claimed in claim 1, wherein, said ultra high frequency circuit is in the form of a hybrid circuit on a ceramic substrate, and the thickness of the air layer is at least equal to the thickness of the substrate.

3. The ultra high frequency circuit as claimed in claim 1, wherein, said ultra high frequency circuit is in the form of an integrated circuit on a semiconductor material substrate, and the thickness of the air layer is at most equal to half the thickness of the substrate.

4. The ultra high frequency circuit as claimed in claim 1, wherein the demetallized region of the ground plane has greater dimensions than those of the component fixing mttallization which is in line therewith, so as to avoid the leak lines of the electric field from the fixing metallization through the substrate.

5. The ultra high frequency circuit as claimed in claim 1, wherien, said ultra high frequency circuit is in the form of a hybrid circuit, and is fixed to a metal sole piece pierced in a region corresponding to said local demetallization.

6. The ultra high frequency circuit as claimed in claim 1, wherein, said ultra high frequency circuit is in the form of an integrated circuit, and the substrate of this integrated circuit is recessed in a region corresponding to said local demetallization.

7. The ultra high frequency circuit as claimed in claim 1, wherein the base of said case is pierced in a region corresponding to said local demetallization.

* * * * *